United States Patent [19]
Manson et al.
[11] 3,909,723
[45] Sept. 30, 1975

[54] FM/AM RADIO RECEIVER TUNING APPARATUS

[75] Inventors: Peter St. Clair Manson, Barrington, Ill.; Basil P. Hooten, Northville, Mich.

[73] Assignee: Motorola, Inc., Chicago, Ill.

[22] Filed: Aug. 5, 1974

[21] Appl. No.: 494,666

[52] U.S. Cl. ................ 325/315; 325/346; 325/421; 331/47
[51] Int. Cl.[2] ........................ H04B 1/06; H04B 1/16
[58] Field of Search ........... 325/315, 422, 423, 442, 325/446, 449, 452, 453, 416, 468, 418, 464-465, 432-433, 420-421; 334/3, 11, 14-18; 331/18, 47

[56] References Cited

UNITED STATES PATENTS 3,657,654 4/1972 Friberg ................................ 325/452
3,824,410 7/1974 Funaki et al. ....................... 331/18 X
3,839,678 10/1974 Bell .................................. 334/14 X

*Primary Examiner*—Robert L. Griffin
*Assistant Examiner*—Robert Hearn
*Attorney, Agent, or Firm*—James W. Gillman; Donald J. Lisa

[57] ABSTRACT

A phase locked loop including a voltage controlled oscillator utilized as the FM oscillator in the FM front end and the DC voltage from the phase locked loop also is utilized to tune the remaining front end circuits of the FM radio receiver. The output of the voltage controlled oscillator is mixed with the output of a fixed oscillator and divided so it is the same frequency as the output of the AM oscillator in the tuner. The AM oscillator and the divided frequency from the mixer are applied to two inputs of a phase comparator with the output being filtered and amplified to provide the DC for controlling the voltage controlled oscillator.

7 Claims, 1 Drawing Figure

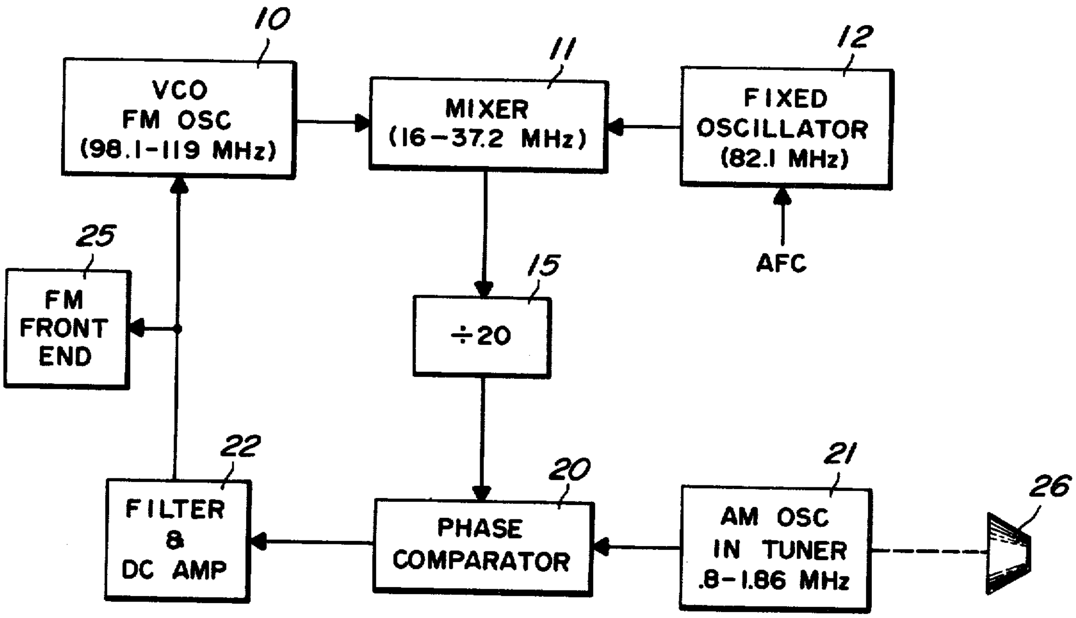
VCO
FM OSC
(98.1-119 MHz)
10
MIXER
(16-37.2 MHz)
11
FIXED
OSCILLATOR
(82.1 MHz)
12
AFC
25
FM
FRONT
END
15
÷20
22
FILTER
&
DC AMP
20
PHASE
COMPARATOR
21
AM OSC
IN TUNER
.8-1.86 MHz
26

FM/AM RADIO RECEIVER TUNING APPARATUS

BACKGROUND OF THE INVENTION

1. Field of the Invention

Radio receivers including FM and AM reception are very common, especially in the automotive field. It is, of course, desirable that both the FM and AM channels of the receiver are tunable by a single control or controls. Further, it is becoming increasingly more desirable to construct the radio as small as possible and, in many instances, it is desirable to have the tuning controls remote from all or a portion of the receiver.

2. Description of the Prior Art

It is of course obvious that each of the circuits in the AM and FM front ends can be tuned from a single control by providing a mechanically tunable component, such as a variable capacitor or coil, in each of the circuits and mechanically connecting them to a common control. This mechanical tuning and mechanical linkage of all the tuning elements results in a relatively large and unwieldily tuning system. To reduce the size of the tuning system, and because of the development of low cost Varactor diodes, electronic tuning of the FM front end has become relatively common. Generally the AM front end is mechanically tuned and the tuning of the AM front end generates a DC voltage which is utilized to electronically tune the FM front end. In all prior art devices of this type a variable DC voltage is produced directly by means of a mechanically variable component, such as a potentiometer or coil, and the DC voltage is then supplied to the FM front end to electronically control the tuning thereof. All of these prior art systems are subject to variations in tuning due to component changes because of age, temperature, etc. Further, it is a relatively difficult task to align the mechanical tuning and the DC voltage to produce the correct FM tuning.

SUMMARY OF THE INVENTION

This invention pertains to an FM/AM radio receiver tuning apparatus including a voltage controlled FM oscillator and a fixed oscillator supplying signals to a mixer which provides an output that, upon being properly divided, is the same frequency as the output of the Am oscillator in the AM tuner. The divided frequency and the output of the AM oscillator are supplied to a phase comparator which provides an output that is used to control the frequency of the voltage controlled FM oscillator and the remaining tunable circuits in the FM front end.

It is an object of the present invention to provide an improved FM/AM radio receiver tuning apparatus.

It is a further object of the present invention to provide an FM/AM radio receiver tuning apparatus which includes a voltage controlled FM oscillator in a phase locked loop, said voltage controlled oscillator being locked to the AM oscillator in the AM tuner.

These and other objects of this invention will become apparent to those skilled in the art upon consideration of the accompanying specification, claims and drawing.

BRIEF DESCRIPTION OF THE DRAWING

The single FIGURE is a block diagram of an embodiment of the FM/AM radio receiver tuning apparatus.

DESCRIPTION OF THE PREFERRED EMBODIMENT

Referring to the FIGURE, the numeral 10 designates a voltage controlled FM oscillator, which may be any of the voltage controlled oscillators utilizing Varactors and the like, well known to those skilled in the art. In the present embodiment the FM radio receiver is tuned to a 10.7 MHz IF frequency and the voltage controlled FM oscillator 10 is set above the incoming frequency so that the oscillator 10 operates in a range from 98.1 MHz to 119.3 MHz. It will of course be understood by those skilled in the art that the FM oscillator can operate above or below the incoming signal and the IF frequency can be any desired frequency, but the present system was elected because of its previous acceptance in the field.

The output of the voltage controlled FM oscillator 10 is supplied to one input of a mixer 11 and a second input of the mixer 11 is received from an output of a fixed oscillator 12. In the present embodiment, the fixed oscillator 12 operates at 82.1 MHz and the mixer 11 provides an output which is equal to the difference between the frequency of the oscillator 10 and the oscillator 12, i.e, 16 to 37.2 MHz. The fixed oscillator 12 can be a stable oscillator, such as a crystal oscillator or the like, and, further, if desired an automatic frequency control signal can be produced in the FM receiver in the normal fashion and applied to the fixed oscillator to maintain the output thereof at the desired frequency.

The output of the mixer 11 is supplied through a divider 15 to one input of a phase comparator 20. Because of the specific frequencies selected in this embodiment the divider 15 is a divide by 20 circuit, which reduces the frequencies from the mixer to 0.8 to 1.86 MHz. A second input of the phase comparator 20 receives a signal from an AM oscillator 21, which is the local oscillator in the tuner of the AM radio receiver. The AM oscillator 21 provides a signal having a frequency in the range of 0.8 to 1.86 MHz. The phase of the signals from the divider 15 and the AM oscillator 21 are compared in the phase comparator 20 and the output is applied through a filter and DC amplifier 22 to the control input of the voltage controlled oscillator 10. The output signal from the filter and DC amplifier 22 is also applied to FM front end circuits 25, which include an FM antenna circuit and RF circuits.

The AM oscillator 21 is tunable in some well known manner, such as a manual tuning knob 26 connected to a tunable component of the oscillator 21. As the AM oscillator 21 is tuned through its band the voltage controlled FM oscillator 10 is forced to tune through its band by the phase locked loop. Further, the DC voltage from the filter and DC amplifier 22 which is utilized to control the voltage controlled FM oscillator 10 is also utilized to control the remaining FM front end circuits 25 and, therefore, additional compensating circuits and the like are not required. Further, since the stability of the voltage controlled FM oscillator 10 is a function of the stability of the AM oscillator 21, automatic frequency control can be obtained from the FM receiver in the normal manner and applied to the AM oscillator 21, if desired or required to add stability to the circuit. The majority of the circuitry disclosed can be provided in IC form to greatly reduce the size and complexity thereof and the complexity of the mechanical tuning and linkage is greatly reduced because no mechanical connections or tuning is required in the FM radio receiver. In addition to the above advantages, locking the voltage controlled FM oscillator 10 into the AM oscillator 21 greatly reduces errors prevalent in prior art circuits which required variable components to produce a direct DC voltage and which relied upon the stability of the produced DC voltage for stability in tuning.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. FM/AM radio receiver tuning apparatus comprising:

a. an AM oscillator and means for tuning said AM oscillator through a predetermined range;

b. an FM radio receiver front end including an FM oscillator, an FM antenna circuit and RF circuits each including voltage sensitive means for electronically tuning said FM oscillator and remaining FM circuits to predetermined frequencies in response to predetermined voltages being applied thereto;

c. a fixed oscillator;

d. a mixer connected to said FM oscillator and said fixed oscillator for receiving signals therefrom and providing an output signal having a frequency which is a heterodyne or beat frequency of the frequencies of the two input signals;

e. a phase comparator having two inputs and an output with one input connected to receive a signal from said AM oscillator;

f. means connecting the output of said mixer to the second input of said comparator; and g. means connecting the output of said comparator to the voltage sensitive means of said FM oscillator, FM antenna circuit and RF circuits for providing a predetermined voltage thereto in response to said AM oscillator being tuned to a predetermined frequency.

2. FM/AM radio receiver tuning apparatus as claimed in claim 1 wherein the means connecting the output of the mixer to the second input of the comparator includes frequency divider circuitry.

3. FM/AM radio receiver tuning apparatus as claimed in claim 2 wherein the frequency of the FM receiver IF strip is 10.7 MHz, the fixed oscillator is tuned to 82.1 MHz and the frequency divider circuitry includes circuits which divide the frequency by twenty.

4. FM/AM radio receiver tuning apparatus as claimed in claim 1 wherein the voltage sensitive means include varactors.

5. FM/AM radio receiver tuning apparatus as claimed in claim 1 wherein the means connecting the output of the comparator to the voltage sensitive means includes a filter and DC amplifier.

6. FM/AM radio receiver tuning apparatus as claimed in claim 1 including in addition an automatic frequency control circuit connected to the fixed oscillator.

7. FM/AM radio receiver tuning apparatus as claimed in claim 1 wherein the phase comparator is a comparator which locks on the leading edge of input signals to prevent locking onto a harmonic.

* * * * *